United States Patent [19]

Takemae

[11] Patent Number: 4,578,697

[45] Date of Patent: Mar. 25, 1986

[54] SEMICONDUCTOR DEVICE ENCAPSULATING A MULTI-CHIP ARRAY

[75] Inventor: Yoshihiro Takemae, Yokohama, Japan

[73] Assignee: Fujitsu Limited, Kawasaki, Japan

[21] Appl. No.: 388,616

[22] Filed: Jun. 15, 1982

[30] Foreign Application Priority Data

Jun. 15, 1981 [JP] Japan .................. 56-091799

[51] Int. Cl.[4] ........................... H01L 23/16
[52] U.S. Cl. ....................... 357/75; 357/74; 357/80; 361/417; 361/419; 361/420; 361/421
[58] Field of Search .................. 357/74, 75, 80; 361/417, 419, 420, 421

[56] References Cited

U.S. PATENT DOCUMENTS

| | | | |
|---|---|---|---|
| 3,312,771 | 4/1967 | Hessinger et al. | 357/80 |
| 3,483,038 | 12/1969 | Hui et al. | 357/75 |
| 3,568,012 | 3/1971 | Ernst | 357/80 |
| 3,611,317 | 10/1971 | Bonfeld | 340/173 R |
| 3,641,401 | 2/1972 | Lynch | 357/80 |
| 3,777,221 | 12/1973 | Tatusko et al. | 357/80 |
| 3,903,590 | 9/1975 | Yokogawa | 357/80 |
| 4,038,488 | 7/1977 | Lin | 357/74 |
| 4,297,719 | 10/1981 | Hsu | 357/23 TF |

FOREIGN PATENT DOCUMENTS

| | | | |
|---|---|---|---|
| 2266305 | 10/1975 | France . | |
| 54-8976 | 1/1979 | Japan | 357/75 |
| 2026234 | 1/1980 | United Kingdom | 357/80 |
| 2056772A | 3/1981 | United Kingdom . | |

Primary Examiner—Martin H. Edlow
Assistant Examiner—Jerome Jackson
Attorney, Agent, or Firm—Staas & Halsey

[57] ABSTRACT

A semiconductor device having a chip-array construction comprising a plurality of semiconductor chips (1-1~1-4) and a package (4) on which the semiconductor chips are mounted. On the package, common conductive strips (9-1~9-6) which are commonly used for all the chips and arranged between the package and the chips and individual conductive strips (10-1~10-4) which are used peculiar to each of the chips, are provided. Such common conductive strips and individual conductive strips are formed by a single conductive layer.

9 Claims, 9 Drawing Figures

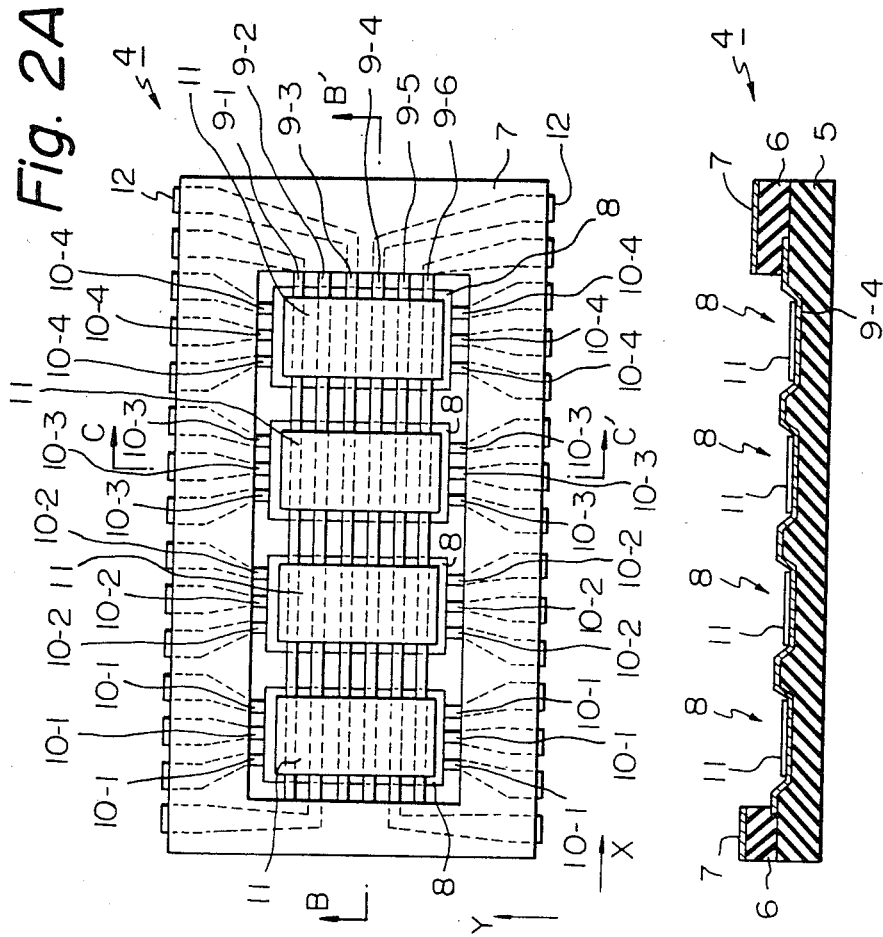
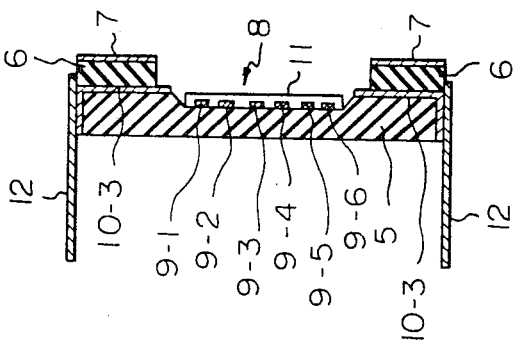
Fig. 2A
Fig. 2B
Fig. 2C

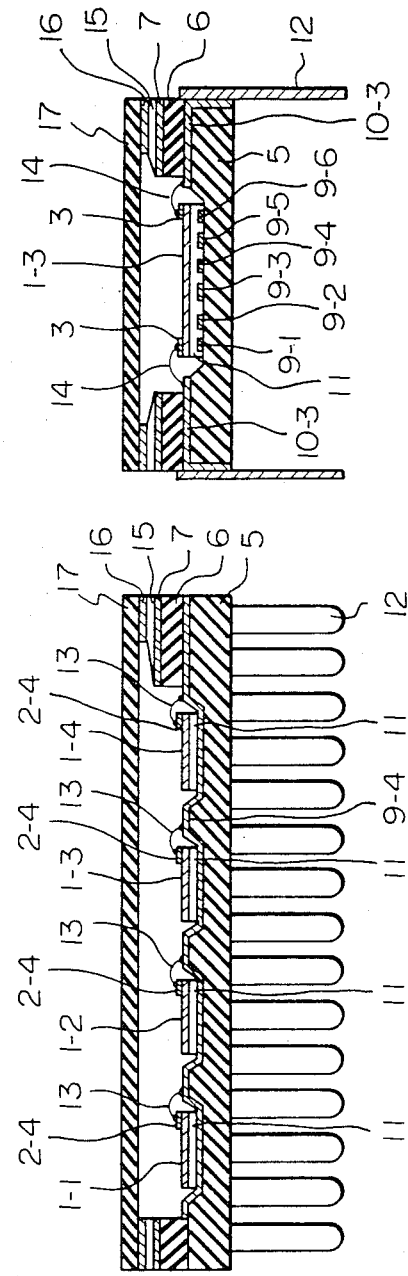

SEMICONDUCTOR DEVICE ENCAPSULATING A MULTI-CHIP ARRAY

BACKGROUND OF THE INVENTION (1) Field of the Invention

The present invention relates to a semiconductor device, particularly to a chip-array-constructed semiconductor device in which a plurality of semiconductor chips are mounted on a package.

(2) Description of the Prior Art

Usually, in semiconductor integrated circuit (IC) devices such as semiconductor logic devices or semiconductor memory devices, only one semiconductor IC chip is mounted on a package. On the other hand, as a computer systems performance and capacity, increase the number of packages having electric components such as semiconductor IC chips mounted thereon also increase, causing the computer system to be large. In view of this, recently, a plurality of semiconductor IC chips have been mounted on a package and, accordingly, the packing density of the semiconductor IC chips has increased. Such a semiconductor package having a plurality of semiconductor chips mounted thereon is called a chip-array-constructed semiconductor device.

In the chip-array-constructed semiconductor device, however, in order to avoid the intersection of bonding wires in a package, a multilayer printed board is used as the package. As a result, the semiconductor device becomes costly.

SUMMARY OF THE INVENTION

It is, therefore, an object of the present invention to provide a chip-array-constructed semiconductor device which can be manufactured at a low cost.

According to the present invention, there is provided a semiconductor device comprising: a plurality of semiconductor chips having circuit elements thereon and having common connection pads and individual connection pads arranged along the periphery thereof; a package on which a plurality of semiconductor chips are mounted in series; and a single conductive layer deposited on the package, the single conductive layer comprising common conductive strips commonly used for the plurality of semiconductor chips and arranged between the package and the plurality of semiconductor chips, and comprising individual conductive strips peculiar to each of said semiconductor chips and arranged on one or both sides of the common conductive strips, each of the common connection pads being electrically connected to one of the common conductive strips and each of the individual connection pads being electrically connected to one of the individual conductive strips.

BRIEF DESCRIPTION OF THE DRAWINGS

The present invention will be more clearly understood from the description as set forth below with reference to the accompanying drawings, wherein:

FIGS. 1, 2A, 2B, 2C, 3A, 3B, 3C, 4A, and 4B are diagrams illustrating the assembling steps of the semiconductor device according to the present invention.

DESCRIPTION OF THE PREFERRED EMBODIMENTS

Figure 1:
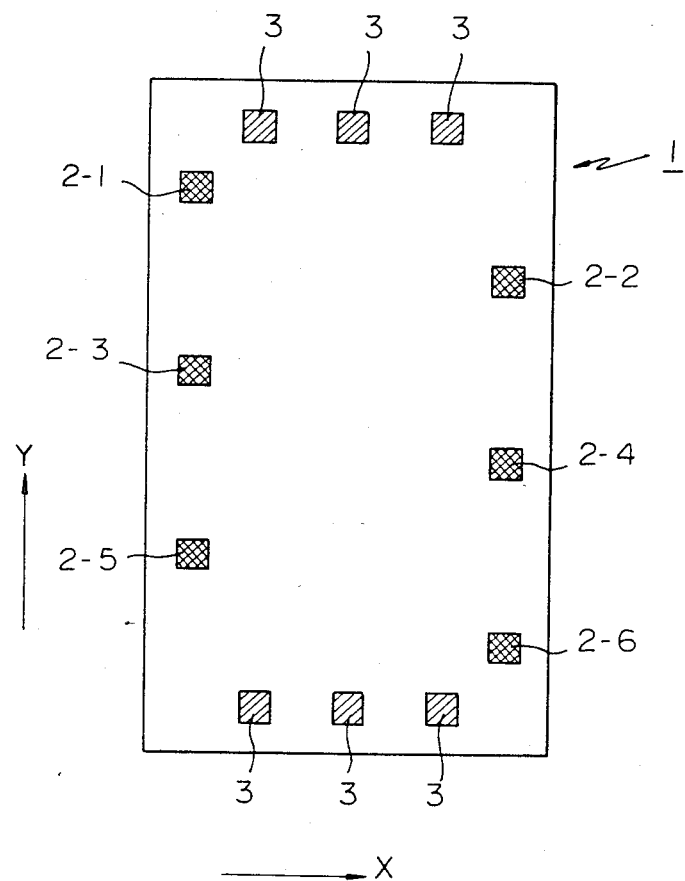

The assembling steps of the semiconductor device will now be explained. First, a plurality of semiconductor chips such as the semiconductor chip 1 illustrated in FIG. 1 are prepared. In FIG. 1, which is a plan view illustrating an embodiment of the semiconductor chip according to the present invention, the semiconductor chip 1 has circuit elements (not shown) such as memory cells and the like formed thereon. The cross-hatched portions 2-1 through 2-6 indicate common connection pads for receiving common signals such as common power supply voltages, common address signals, and the like while the hatched portions 3 indicate individual connection pads for receiving an individual signal such as a clock signal, an input/output signal, or the like peculiar to this chip. The connection pads 2-1 through 2-6 and 3 are arranged along peripheral portions of the chip 1. For example, the pads 2-1 through 2-6 are arranged along the Y-axis, while the pads 3 are arranged along the X-axis. Note that the connection pads 2-1 through 2-6 and 3 are formed by a single conductive layer such as aluminum (Al) or the like.

FIG. 2A is a plan view illustrating an embodiment of the package according to the present invention, and FIGS. 2B and 2C are cross-sectional views taken along the line B-B' and the line C-C', respectively, of FIG. 2A. Referring to FIGS. 2A through 2C, a package 4 comprises a ceramic base 5, made of alumina or the like, to which a ceramic frame 6 having a metallized layer 7 for sealing thereon is bonded with glass (not shown). In addition, the ceramic base 5 has recess portions 8 for mounting semiconductor chips thereon.

On the ceramic base 5, including its recess portions 8, a plurality of common conductive strips 9-1 through 9-6 are arranged in parallel to the X-direction and extend to the end face on the longer side of the ceramic base 5. In addition, on the ceramic base 5, a plurality of individual conductive strips 10-1 through 10-4 are arranged on at least one side (in this case, on both sides) of the common conductive strips 9-1 through 9-6 in parallel to the Y-direction and extend to the end surface on the longer side of the ceramic base 5. Note that exposed portions of the conductive strips 9-1 through 9-6 and 10-1 through 10-4 at the edges of the recess portions 8 are called bonding posts.

Reference numeral 11 indicates a chip base bonded with glass (not shown) to each recess portion 8. The chip base 11 is formed from, for example, a ceramic plate of alumina, beryllia, or the like. Reference numeral 12 indicates an external lead made of Kovar or the like which is bonded by soldering to one of the conductive strips 9-1 through 9-6 and 10-1 through 10-4.

Figure 3A:
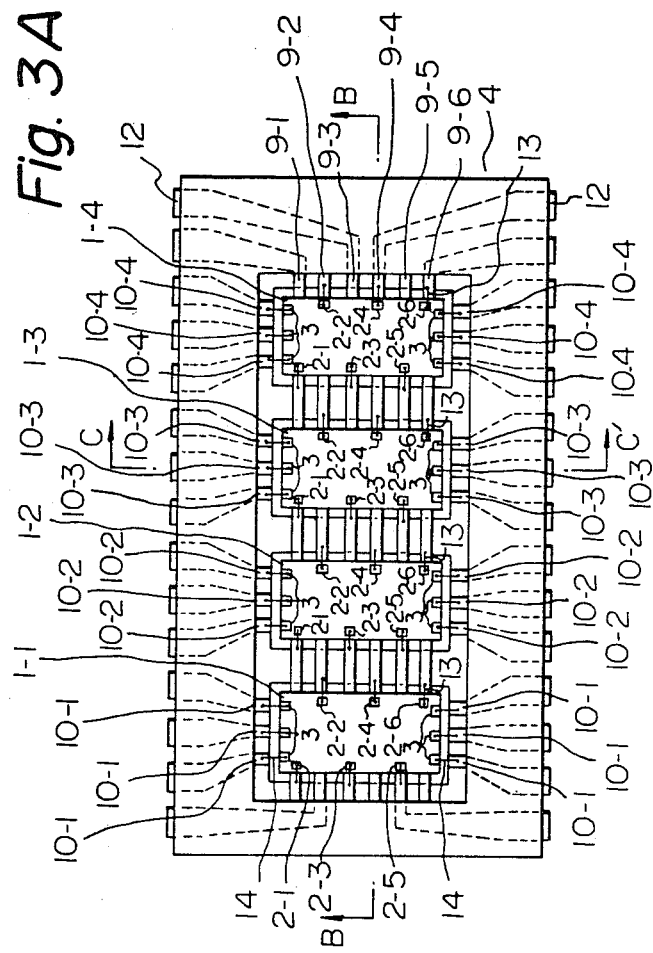
Figure 3C:
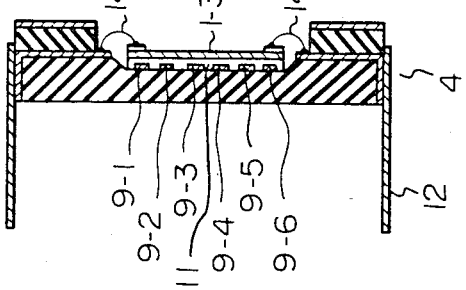
Figure 3B:
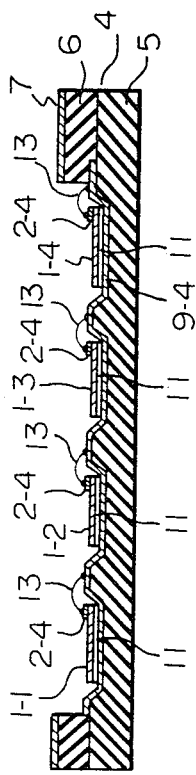

In FIGS. 3A, 3B, and 3C, which are similar to FIGS. 2A, 2B, and 2C, respectively, four semiconductor chips 1-1 through 1-4, which are the same as the chip 1 illustrated in FIG. 1, are mounted on the package as illustrated in FIGS. 2A, 2B, and 2C. Each of the semiconductor chips 1-1 through 1-4 is fixed by depositing epoxy resin (not shown) on each of the chip bases 11 of the package 4.

The common conductive strips 9-1 through 9-6 are commonly used for the semiconductor chips 1-1 through 1-4 while the individual conductive strips 10-1, 10-2, 10-3, and 10-4 are peculiar to the semiconductor chips 1-1, 1-2, 1-3, and 1-4, respectively.

For example, each common connection pad 2-1 through 2-6 of the semiconductor chip 1-1 is electrically connected to the bonding post of the respective common conductive strip 9-1 through 9-6 by bonding wires 13, while the individual connection pads 3 of the semiconductor chip 1-1 are electrically connected to the individual conductive strips 10-1 by bonding wires 14. In this case, the wires 13 and 14 are made of aluminum, gold, or the like.

In FIGS. 4A and 4B, which are similar to FIGS. 3B and 3C, respectively, a sealing-completed semiconductor device is illustrated. Reference numeral 15 indicates solder material, 16 is a metallized layer for sealing, and 17 indicates a cap formed from a ceramic plate.

In the above-mentioned embodiment, chip bases 11 made of ceramic material are provided between the semiconductor chips 1-1 through 1-4 and the common conductive strips 9-1 through 9-6; however, such chip bases 11 can be omitted when semiconductor chips having thick insulated layers on the back thereof, or silicon-on-saphire (SOS) chips are used.

As explained hereinbefore, the semiconductor device according to the present invention is advantageous in that the manufacturing cost is decreased since the semiconductor device, which has a chip-array construction, is formed by using a single conductive layer-constructed package which is manufactured at a decreased cost. Therefore, the present invention provides semiconductor devices of high packing density while decreasing cost, thereby enabling a computer system to be smaller in size than is known in the art.

I claim:

1. A semiconductor device comprising:
   (a) a plurality of semiconductor chips, each chip having perpendicular X- and Y-axes, circuit elements, common connection pads arranged along the peripheral portions of the X-axis, and individual connection pads arranged along the peripheral portions of the Y-axis;
   (b) a package having perpendicular X- and Y-axes, said plurality of semiconductor chips being arranged in series along the Y-axis of the package; and
   (c) a conductive layer formed on said package, said conductive layer having
      (i) common conductive strips commonly used for said plurality of semiconductive chips and extending along said Y-axis of said package to said plurality of semiconductor chips, and
      (ii) individual conductive strips corresponding to each of said semiconductor chips and arranged laterally of said common conductive strips,
   wherein each of said common connection pads is electrically connected to one of said common conductive strips and each of said individual connection pads is electrically connected to one of said individual conductive strips.

2. A device as set forth in claim 1, wherein said package comprises:
   (a) a ceramic base;
   (b) a ceramic frame mounted on said ceramic base; and
   (c) a ceramic cap mounted on said ceramic frame, whereby said package is sealed.

3. A device as set forth in claim 2, further comprising a plurality of recess portions provided in said ceramic base for mounting said semiconductor chips.

4. A device as set forth in claim 3, further comprising chip bases for isolating said semiconductor chips from said common conductive strips in said recess portions of said ceramic base.

5. A device as set forth in claim 1, wherein said common conductive strips are arranged in parallel to each other.

6. A device as set forth in claim 3, wherein each of said semiconductor chips has a thick insulated layer on the back thereof.

7. A device as set forth in claim 6, wherein said semiconductor chip is a silicon-on-saphire chip.

8. A device as set forth in claim 1, wherein the individual conductive strips are arranged on one side of said common conductive strips.

9. A device as set forth in claim 1, wherein the individual conductive strips are arranged on both sides of said common conductive strips.

* * * * *